United States Patent
Matsumoto et al.

(10) Patent No.: US 6,597,238 B1
(45) Date of Patent: Jul. 22, 2003

(54) DEMODULATING CIRCUIT OF WIRELESS RECEIVING APPARATUS AND DEMODULATING METHOD

(75) Inventors: Hidenori Matsumoto, Kanagawa (JP); Atsuhiko Hashigaya, Kanagawa (JP)

(73) Assignee: Matsushita Electric Industrial Co., Ltd, Osaka (JP)

(*) Notice: Subject to any disclaimer, the term of this patent is extended or adjusted under 35 U.S.C. 154(b) by 0 days.

(21) Appl. No.: 09/553,840

(22) Filed: Apr. 21, 2000

(30) Foreign Application Priority Data

Apr. 22, 1999 (JP) ............................................. 11-115122

(51) Int. Cl.⁷ ............................................... H03D 3/00
(52) U.S. Cl. ........................ 329/300; 375/316; 375/317; 375/324; 375/340; 455/214; 455/134
(58) Field of Search ................................. 375/334, 335, 375/345, 340, 316, 317, 324; 329/300; 455/161.3, 134, 334, 214

(56) References Cited

U.S. PATENT DOCUMENTS 5,949,280 A * 9/1999 Sasaki ........................ 329/303
6,304,136 B1 * 10/2001 Rabii ......................... 329/300
6,311,049 B1 * 10/2001 Yoshizawa ................ 455/250.1
6,356,746 B1 * 3/2002 Katayama .................... 455/324

* cited by examiner

Primary Examiner—Arnold Kinkead
(74) Attorney, Agent, or Firm—Pearne & Gordon LLP

(57) ABSTRACT

A demodulating circuit 1 contains an electric field level detector 2 for detecting an electric field strength from a received modulation signal, comparators 3a to 3n for outputting electric field strength information PS, a detector 5 for outputting a detection signal corresponding to a modulation signal, both a low-pass filter 6 and a digital filter 12 for removing a noise component from the detection signal, and a data comparator 7 for comparing the detection signal with a reference voltage to output a digital signal. This demodulating circuit 1 further includes a control circuit 4 for controlling a cutoff frequency used in a digital filter 12, an output voltage amplitude of the detector 5, and the reference voltage of the data comparator 7 in accordance with both the electric field strength information PS and control condition information PC saved in an EEPROM 11 and supplied from a CPU 10, and also a judging circuit 9 for judging the digital signal at preselected timing to produce a demodulation signal.

19 Claims, 8 Drawing Sheets

RATE OF VOLTAGE AMPLITUDE OF
DETECTION SIGNAL TO LSB-JUDGING LEVEL (%)
(REFERENCE VOLTAGE OF DATA COMPARATOR)

FREQUENCY SHIFT (kHz)

DEMODULATING CIRCUIT OF WIRELESS RECEIVING APPARATUS AND DEMODULATING METHOD

BACKGROUND OF THE INVENTION

The present invention is related to a demodulating circuit for demodulating a reception signal in a wireless receiving apparatus such as a pager and also related to a demodulating method. More specifically, the present invention is directed to a demodulating circuit and a demodulating method employed in a wireless receiving apparatus, in which a modulation signal converted into an intermediate frequency band by the FSK modulation is demodulated to output a demodulation signal.

In demodulating circuits of wireless receiving apparatuses, operating parameters of respective circuit portions are set so as to optimize S/N of signal reception systems. In the case that a modulated multi-level FSK signal is demodulated in, for example, the FLEX system pager (will be referred to as an "FLEX pager" hereinafter), an amplitude value of an output voltage of a detector is set in such a manner that S/N can be optimized in response to a transfer speed of data. Also, a reference voltage value of a data comparator for outputting a digital demodulation signal is set in such a manner that an error judging rate can be minimized. Also, in a low-pass filter provided between the detector and the data comparator, a cutoff frequency is set in response to the data transfer speed in such a manner that S/N can be optimized by removing an unnecessary frequency component. In demodulating circuits employed in mobile communication appliances such as the above-explained FLEX pager, generally speaking, various sorts of setting values are determined under such a condition that electric field strengths are low so as to optimize S/N. As a result, performance of wireless receiving apparatuses may be improved.

As previously explained, in the conventional demodulating circuits of the wireless receiving apparatuses, the various sorts of setting values are determined in such a way that S/N can be optimized under such a condition that the electric field strengths are low. However, there are certain possibilities that when the electric field strengths are high, the above-explained setting values are not equal to the optimum setting values, resulting in lowering of the reception performance.

More specifically, in a pager system where transmission signals are transmitted from a plurality of base stations at the same time, the following difficulties are revealed. That is, in an area where electric field levels of transmission signals (FSK-modulation waves) transmitted from the plural base stations become substantially equal to each other (namely, overlap (equi-field) area), or in an area where a multipath occurs in transmission signals (namely, multipath area), electric field strengths at reception points are largely varied by receiving adverse influences caused by frequency shifts among the plural transmission signals and by phase delays. As a result, bit error rates of demodulation signals would be deteriorated. Under such a condition that the overlap and/or the multipath occur in an area, generally speaking, in such an area, electric field strengths are higher than medium field strengths. Therefore, even when the setting values determined by the above-explained low electric field strengths are used, better reception performance could not be achieved. Also, as reception performance with respect to a frequency shift between a set frequency of a receiving apparatus and a frequency of a transmission signal, a so-called "band characteristic (i.e., bandwidth characteristic of calling rate) is known in this technical field. It is also revealed that a setting value at which a maximum S/N value can be obtained is not always made coincident with another setting value at which a maximum value of a band characteristic.

As a consequence, the following problem occurs in the conventional demodulating circuit arranged by that S/N is optimized under such a condition that the electric field strength is low. That is, the better reception performance can be obtained under such a low electric field strength. However, the reception performance would be deteriorated in the overlap area and the multipath area existed in the medium electric field strength and the low electric field strength, so that the calling rate would be lowered.

SUMMARY OF THE INVENTION

The present invention has been made to solve the above-described problems, and therefore, has an object to provide a demodulating circuit of a wireless receiving apparatus capable of performing optimum demodulating operations in various electric field strengths such as a low electric field strength and higher than a medium electric field strength by controlling a detecting means, a filter means, and a comparing means provided in the demodulating circuit of the wireless receiving apparatus such as a pager in response to the electric field strength. Also, the present invention owns an object to provide a demodulating method capable of executing optimum demodulating operations even under such electric field strengths.

To solve the above-described problems, a demodulating circuit of a wireless receiving apparatus according to first aspect of the present invention which demodulates a received modulation signal to output a demodulation signal, comprises: electric field level detecting means for detecting an electric field strength of a reception signal based upon the modulation signal; detecting means for detecting the modulation signal to output a detection signal; filter means for removing a noise component from the reception signal; comparing means for comparing the detection signal with a predetermined reference voltage to output a digital signal in correspondence with the modulation signal; and control means for controlling at least one of an amplitude of the voltage outputted from the detecting means, the reference voltage used in the comparing means, and a cutoff frequency of the filter means in correspondence with the electric field strength detected by the electric field level detecting means.

Also, preferably, the detecting means includes a variable gain amplifier; and the control means controls the amplitude of the output voltage of the detecting means by controlling an amplification factor of the variable amplifier. Also, the control means controls at least one of the output voltage amplitude of the detecting means and the reference voltage used in the comparing means in response to the electric field strength, so that a ratio of the output voltage amplitude of the detecting means to the reference voltage used in the comparing means is controlled to a predetermined value.

Also, preferably, the filter means is arranged by comprising a low-pass filter provided at a pre-stage of the comparing means, and a digital filter provided at a post-stage of the comparing means. Also, the control means selectively controls passing, or non-passing of the digital filter in response to the electric field strength. Alternatively, as recited in claim 6, the control means controls a frequency of a clock signal entered into the digital filter in response to the electric field strength.

Otherwise, the filter means is arranged by a low-pass filter provided at a pre-stage of the comparing means; and the control means controls a cutoff frequency of the low-pass filter in response to the electric field strength.

Also, preferably, the demodulating circuit is further comprised of memory means for storing thereinto control condition information related to a plurality of the output voltage amplitudes, a plurality of the reference voltages, and a plurality of the cutoff frequencies, which are set in correspondence with the electric field strength; and the control means performs the control operation in accordance with both electric field strength information indicative of the electric field strength and the control condition information.

A demodulating method of a wireless receiving apparatus according to second aspect of the present invention for demodulating a received modulation signal to output a demodulation signal, comprising: an electric field level detecting step for detecting an electric field strength of a reception signal based upon the modulation signal; a detecting step for detecting the modulation signal to output a detection signal; a noise removing step for removing a noise component from the reception signal; a digitalizing step for comparing the detection signal with a predetermined reference voltage to output a digital signal in correspondence with the modulation signal; and a control step for controlling at least one of an amplitude of the voltage of the detection signal, the reference voltage, and a cutoff frequency used in the noise removing step in correspondence with the detected electric field strength.

Also, preferably, in the control step, at least one of the output voltage amplitude of the detection signal and the reference voltage is controlled in response to the electric field strength, so that a ratio of the output voltage amplitude to the reference voltage is controlled to a predetermined value. Also, in the control step, when said electric field strength is smaller than a preselected threshold value, the cutoff frequency used in removing of the noise is controlled to be lower than that when said electric field strength is larger than the threshold value.

In the demodulating circuit of the wireless receiving apparatus according to the present invention, the detection signal obtained by detecting the received modulation signal is outputted, the noise component is removed from the detection signal, and then this detection signal is compared with a predetermined reference voltage. As a result, the digital signal corresponding to the modulation signal is outputted from the demodulating circuit. Then, the demodulating circuit judges this digital signal at predetermined timing to produce the digital demodulation signal. At this time, the electric field strength of the reception signal is detected by the modulation signal, and the demodulating circuit controls at least one of the voltage amplitude of the detection signal, the reference voltage, and the cutoff frequency used in removing of the noise component in response to the electric field strength of the detected reception signal. As a consequence, the demodulating circuit is controlled in such a way that the ratio of the voltage amplitude of the detection signal to the reference voltage, which as used to produce the digital signal, can become the optimum setting value, and also the cutoff frequency of the filter means can become the optimum setting value in response to the electric field strength.

In order to control the ratio of the voltage amplitude of the detection signal of the reference voltage, either on or both the output voltage of the detecting means and the reference voltage used in the comparing means are varied. In this case, the amplification factor of the amplifier provided in the detecting means is varied, and both the output from the variable current source and the resistance value of the resistor, which may define the reference voltage and are provided in the comparing means, are controlled. For example, in the case that the demodulating circuit uses the overlap characteristic (namely, calling rate characteristic in overlap area) with a top priority, the reference voltage is set to 44 to 64%, preferably on the order of 47 to 55% with respect to the maximum voltage amplitude of the detection signal. On the other hand, in the case that the demodulating circuit uses the band characteristic (namely, bandwidth characteristic of calling rate) with a top priority, the ratio of the reference voltage with respect to the maximum voltage amplitude of the detection signal is set to be on the order of 0.6 to 0.7.

To control the cutoff frequency of the filter means, when the demodulating circuit employs the digital filter, the digital filter is turned ON/OFF to selectively switch passing and not passing of the signal, so that the cutoff frequency of the overall filter means is changed. Otherwise, the frequency of the clock signal entered to the digital filter is controlled so as to change the cutoff frequency of the digital filter itself. On the other hand, when the demodulating circuit is arranged by the analog type low-pass filter, the cutoff frequency of the low-pass filter is varied by switching the circuit constant of this analog low-pass filter by operating, for instance, a switch and the like.

While the cutoff frequency of the filter means is controlled, when the electric field strength is lower than a preselected electric field strength threshold value, the cutoff frequency is controlled to be decreased, whereas when the electric field is higher than a preselected electric field strength threshold value, the cutoff frequency is increased.

In the case that the ratio between the voltage amplitude of the detecting signal and the reference voltage is controlled and further the cutoff frequency of the filter means is controlled by the control means, while the control condition is saved in the memory means, the operation setting values for controlling the subject are selectively switched by two stages in accordance with the electric field strength information and the control condition information by, for example, employing a threshold value between the low electric field and the field higher than the medium electric field. Alternatively, while plural sets of threshold values for the electric field strength are provided, the operation setting values are selectively switched in multiple stages, so that more precise controls may be carried out in response to the electric field strength. It should be understood that the control condition information may be selectively switched, depending upon a difference in reception environments such as use areas and signal transfer speeds. As a result, even in the overlap area and the multipath area which occur under high electric field and medium electric field and the reception performance of which is deteriorated, the demodulating operation can be carried out under optimum condition. Thus, the overlap characteristic can be improved, and the error rate of the demodulation signal can be maintained to the low rate. Therefore, the reception preformation of the wireless receiving apparatus can be improved.

When the control means is constituted by such a hardware circuit as a logic circuit, more highspeed response can be achieved in this control means. Alternatively, either the control means or the entire demodulating circuit may be arranged by a processor for executing a software processing operation.

DETAILED DESCRIPTION OF THE PREFERRED EMBODIMENTS

Referring now to accompanying drawings, an embodiment mode of the present invention will be described. In this embodiment mode, there is shown a structural example of a demodulating circuit employed in a pager (selective paging receiver) corresponding to a mobile communication receiving apparatus as an example of a wireless receiving apparatus.

FIRST EMBODIMENT MODE

Figure 1:
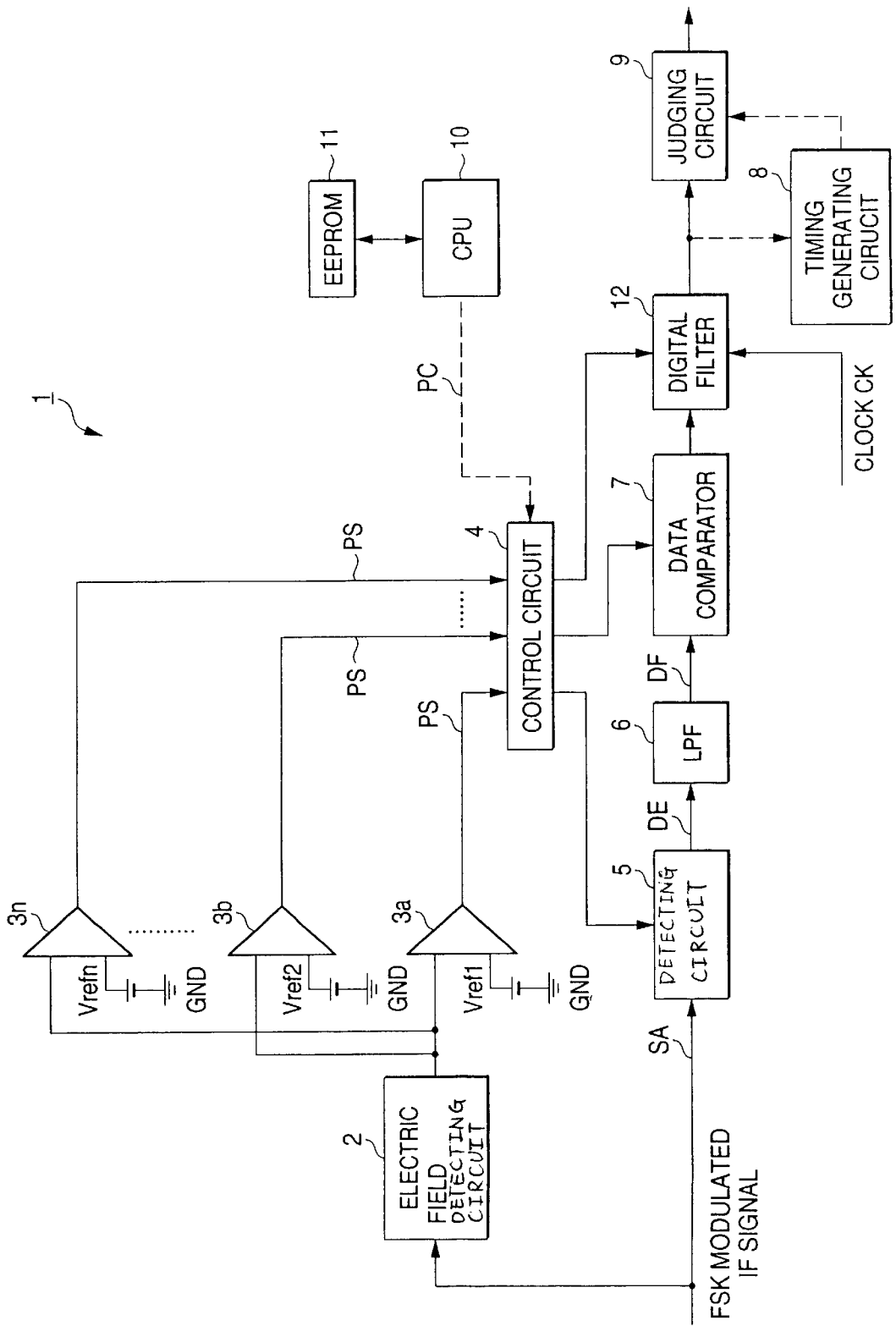
FIG. 1 is a block diagram for indicating a demodulating circuit of a wireless receiving apparatus according to a first embodiment mode of the present invention.
Figure 2:
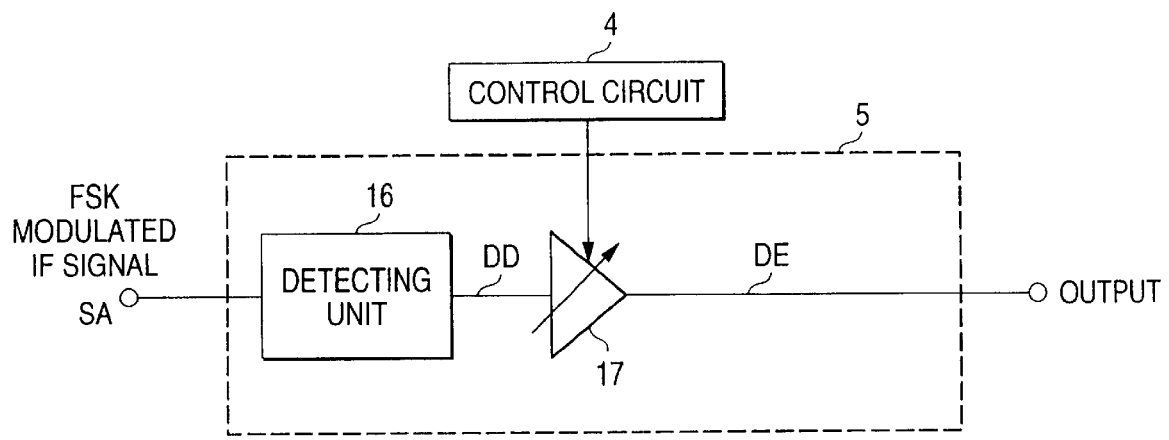
FIG. 2 is a block diagram for representing an arrangement of a detector used in the demodulating circuit of FIG. 1.
Figure 3:
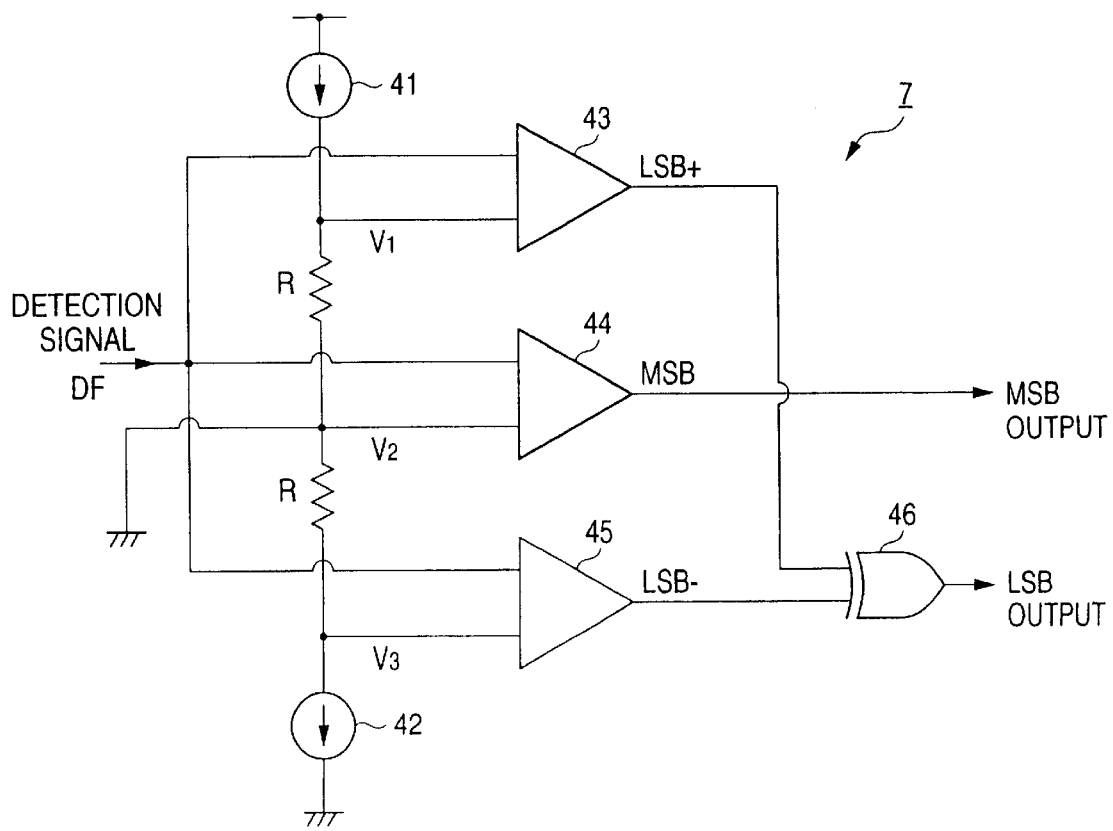
FIG. 3 is a block diagram for showing an arrangement of a 4-level FSK data comparator used in the demodulating circuit of FIG. 1.
Figure 4:
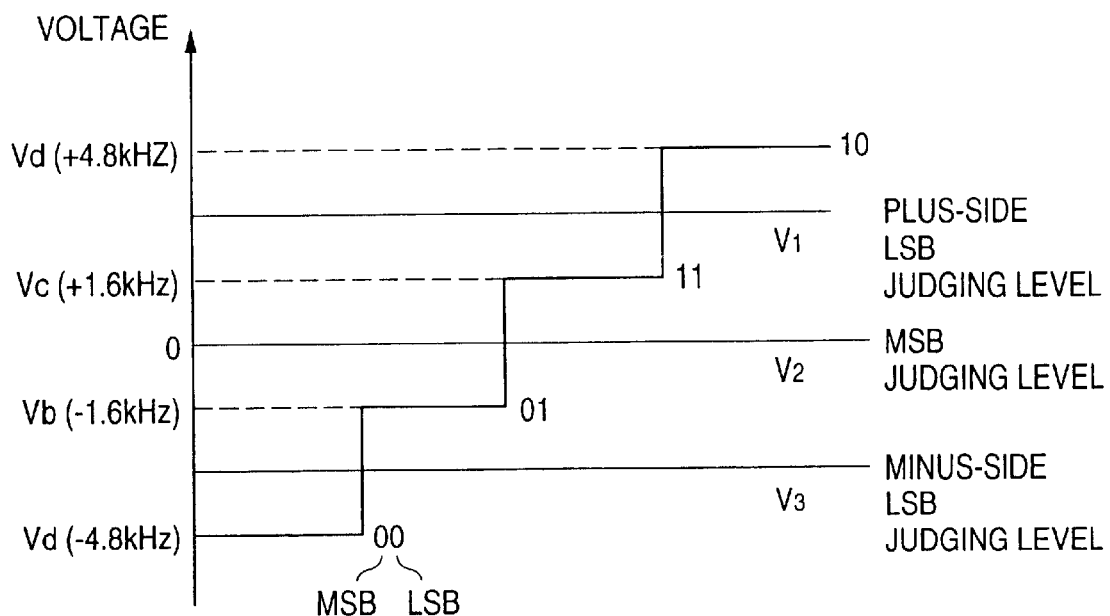
FIG. 4 is an explanatory diagram for explaining operation waveforms appearing in the data comparator of FIG. 3.
Figure 5:
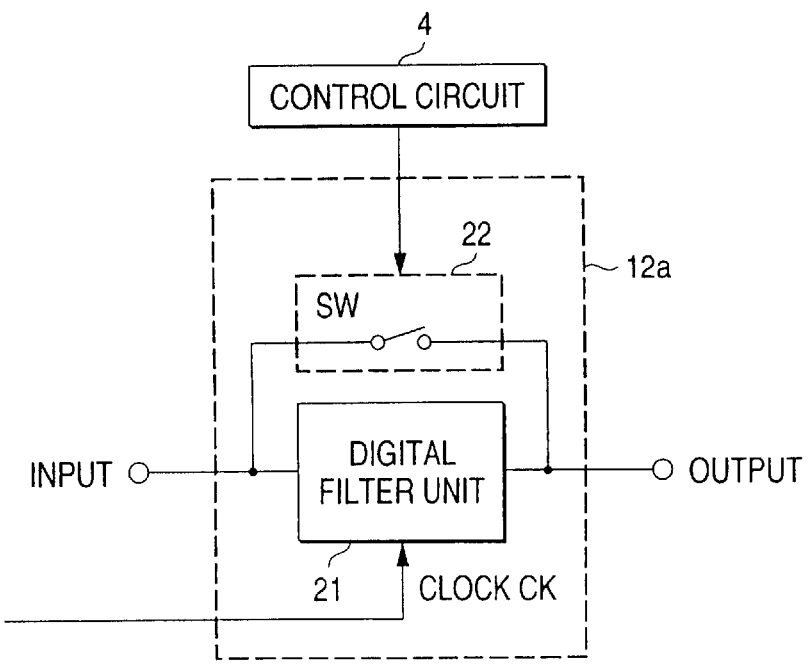
FIG. 5 is a block diagram for indicating a first structural example of a digital filter usable in the demodulating circuit of FIG. 1.
Figure 6:
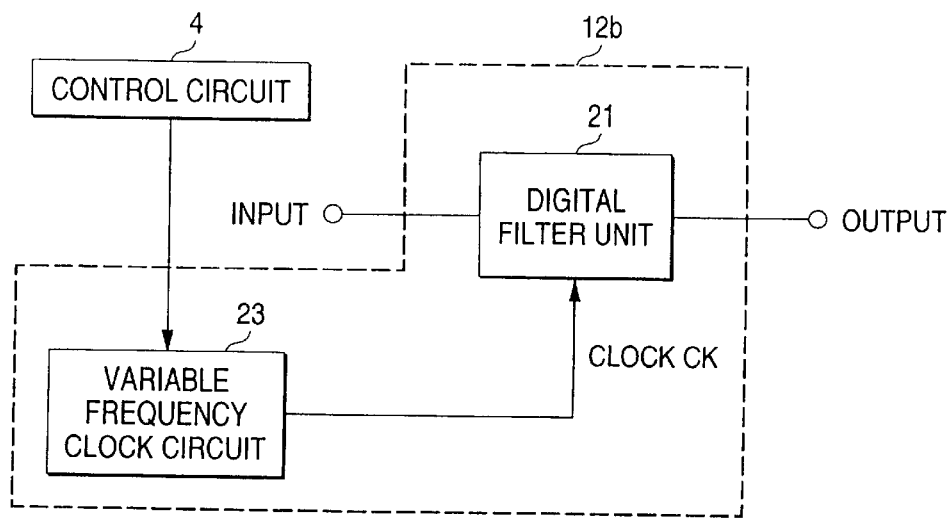
FIG. 6 is a block diagram for showing a second structural example of a digital filter usable in the demodulating circuit of FIG. 1.

FIG. 1 is a block diagram for indicating a demodulating circuit of a wireless receiving apparatus according to a first embodiment mode of the present invention. FIG. 2 is a block diagram for representing an arrangement of a detector used in the demodulating circuit of FIG. 1. FIG. 3 is a block diagram for showing an arrangement of a 4-value FSK data comparator used in the demodulating circuit of FIG. 1. FIG. 4 is an explanatory diagram for explaining operation waveforms appearing in the data comparator of FIG. 3. FIG. 5 is a block diagram for indicating a first structural example of a digital filter usable in the demodulating circuit of FIG. 1. FIG. 6 is a block diagram for showing a second structural example of a digital filter usable in the demodulating circuit of FIG. 1.

The demodulating circuit 1, according to the first embodiment mode, contains at a pre-stage portion, an electric field level detector 2 for detecting an electric field strength of a reception signal (namely, IF signal (intermediate frequency signal) in this example), and also a detector 5 for detecting this IF signal. An IF signal SA which is FSK-modulated (in this case, 4-value FSK modulation) is inputted to both the electric field level detector 2 and the detector 5. At a post-stage of this detector 5, there are provided a low-pass filter 6, a data comparator 7, a digital filter 12, a timing generating circuit 8, and a judging circuit 9. The low-pass filter 6 removes a noise component of a detection signal outputted from the detector 5. The data comparator 7 compares the output of the low-pass filter 6 with a preselected reference voltage to output a digital signal corresponding to the modulation. The digital filter 12 removes an unnecessary component of the digital signal derived from the data comparator 7. The timing generating circuit 8 generates a timing signal. The judging circuit 9 produces a digital modulation signal from the digital signal in response to the timing signal to thereby output the produced digital modulation signal.

The electric field level detector 2 is arranged by a low-pass filter and the like, and detects a received signal strength indicator (RSSI) signal to output a voltage direct proportion to an electric field strength. A plurality of comparators $3a$, $3b$, - - -, $3n$ having different reference voltages from each other are provided on the output side of the electric field level detector 2. The output voltage of the electric field strength detector 2 is applied to one input terminals of the respective comparators $3a$, $3b$, - - -, $3n$ so as to be compared with reference voltages Vref1, Vref2, - - -, Vrefn which are applied to the other input terminals thereof. As a result, the outputs of the comparators $3a$, $3b$, - - -, $3n$ become either a low level (L) or a high; level (H), respectively. These comparator outputs are entered as electric field strength information PS to an electric field strength input unit of a control circuit 4.

With employment of the above-described arrangement, the control circuit 4 may grasp the detailed electric field strength information based upon the output conditions of the plural comparators $3a$, $3b$, - - -, $3n$ having the different reference voltages. It should be noted that the detection resolution of the electric field strength may be increased by increasing a total number of these comparators, whereas when only rough electric field strength information is required, a total number of these comparators may be decreased. That is to say, the comparators may be freely designed, depending upon use purposes.

Also, in this demodulating circuit, there are provided a CPU (central processing unit) 10, and an EEPROM 11. The CPU 10 owns a control function for the entire wireless receiving apparatus, and also sends control condition information PC to a control condition input unit of the control circuit 4. The EEPROM 11 stores thereinto this control condition information PC. The control condition information PC represents a setting value of a control condition in correspondence with an electric field strength. The control circuit 4 is arranged by that this control circuit 4 determines how to operate the detector 5, the data comparator 7, and the digital filter 12 in response to an electric field strength, and also controls these circuit based on the electric field strength information PS and the control condition information PC.

Next, the arrangement of the detector 5 is explained with reference to FIG. 2. The detector 5 is arranged by employing a detecting unit 16 and a variable amplifier 17. The detecting unit 16 enters thereinto the FSK-modulated IF signal SA and frequency/voltage-converts this IF signal SA. Then, this detecting unit 16 outputs a detection signal DD corresponding to a step-shaped voltage signal having such an amplitude direct proportion to modulation deviation. The amplification factor of the variable amplifier 17 is variable in response to a control signal corresponding to an electric field strength, supplied from the control circuit 4. The variable amplifier 17 amplifies the output signal of the detecting unit 16 with this amplification factor, and then supplies the amplified signal as a detection signal,DE to the low-pass filter 6. The low-pass filter 6 is operated with having a certain constant cutoff frequency in this embodiment mode. In this low-pass filter 6, an unnecessary noise component is removed and has a frequency higher than, or equal to the cutoff frequency, and also is contained in the input signal. The filter output from which the noise component has been, removed is supplied as a detection signal DF to the data comparator 7.

Also, referring now to FIG. 3 and FIG. 4, a detailed structure of the data comparator 7 will be explained. In this example, as the data comparator 7, a 4-value FSK data comparator as shown in FIG. 3 is employed. This data comparator 7 is constituted by employing variable current sources 41 and 42; two sets of voltage dividing resistors R; comparators 43, 44, and 45; and further a logic circuit (EX-OR (exclusive-OR) gate circuit) 46. The variable current sources 41 and 42 are controlled by the control circuit 4. The voltage dividing registers R produce reference voltages V1, V2, V3 used to discriminate 4 values from each other. The comparators 43, 44, 45 discriminate a plus-sided LSB (least significant bit), an MSB (most significant bit), and a minus-sided LSB from each other. The exclusive-OR gate circuit 46 OR-gates the comparison outputs from the comparators 43 and 45 to obtain an LSB output. In this data comparator 7, the reference voltages V1, V2, V3 are produced across both edges of the two resistors R by the currents supplied from the variable current sources 41 and 42. These reference voltages V1, V2, V3 are applied as the reference voltages for these comparators 43, 44, 45. The 4 value discriminations of the detection signal DF are carried out by the comparators 43, 44, 45 whose reference voltages are controllable, and also the logic circuit 46. As a result, a 2-bit digital signal is produced and then supplied to the digital filter 12.

FIG. 4 represents discrimination operations between LSB and MSB; in a FLEX pager with employment of the data comparator 7 shown in FIG. 3. The detection signal DF constitutes such a signal that the respective modulation components (−4.8 KHz, −1.6 KHz, +1.6 KHz, +4.8 KHz) in the 4-value FSK modulation are converted into voltages Va, Vb, Vc, Vd corresponding thereto. In this example, as shown in FIG. 4, the detection signal DF is converted into digital signal in such a manner that 0/1 judgement of LSB and MSB is carried out based upon a plus-sided LSB judging level V1, and MSB judging level V2, and a minus-sided LSB judging level V3. In other words, the modulation component of −4.8 KHz is outputted as a digital signal of "00"; the modulation component of −1.6 KHz is outputted as a digital signal of "01"; the modulation component of +1.6 KHz is outputted as a digital signal of "11"; and further, the modulation component of +4.8 KHZ is outputted as a digital signal of "10".

Subsequently, a structure of a digital filter will now be described with reference to FIG. 5 and FIG. 6. A digital filter 12a as a first structural example shown in FIG. 5 contains a digital filter unit 21 for digitally filtering an input signal in response to a clock signal, and a switch 22. This switch 22 is turned ON in response to a control signal, so that the input terminal of the digital filter unit 21 is connected to the output terminal, and thus, the input signal is directly bypassed without being filtered. Since the control circuit 4 supplies ON/OFF signals to the switch 22, this control circuit 4 may control that the input signal may pass through the digital filter 12a, or may not pass through this digital filter 12a. This control circuit 4 controls the cutoff frequency of the entire filter means in connection with the pre-staged low-pass filter 6. In this case, when the cutoff frequency of the digital filter unit 21 is set to be lower than that of the low-pass filter 6 so as to penetrate the input signal through the digital filter 12a, the control circuit 5 controls that the cutoff frequency becomes lower than that obtained when the input signal does not pass through the digital filter 12a.

Also, instead of the digital filter 12a shown in FIG. 5, another digital filter 12b indicated in FIG. 6 may be used. A digital filter 12b as a second structural example contains a digital filter unit 21 for filtering an input signal in response to a clock signal CK, and a variable frequency clock circuit 23. The variable frequency clock circuit 23 varies the frequency of the clock signal CK in response to a control signal supplied from the control circuit 4. The control circuit 4 controls this variable frequency clock circuit 23 so as to vary the frequency of the clock signal CK outputted from the variable frequency clock circuit 23, so that the cutoff frequency of the digital filter unit 21 is controlled with respect to the filter input signal.

As explained above, such a digital signal from which the noise component has been removed by both the low-pass filter 6 and the digital filter 12 is entered into the judging circuit 9 so as to be demodulated. In response to the timing signal produced by the timing generating circuit 8, the judging circuit 9 judges the input signal derived from the digital filter 12 to produce a digital demodulation signal.

Subsequently, a description will now be made of control operation by the control circuit 4 in response to the electric field strength, while exemplifying a characteristic of reception performance achieved in the demodulating circuit according to this embodiment mode. It should be understood that graphic representations indicative of the respective characteristics represent numeral examples obtained by experiments.

Figure 7:
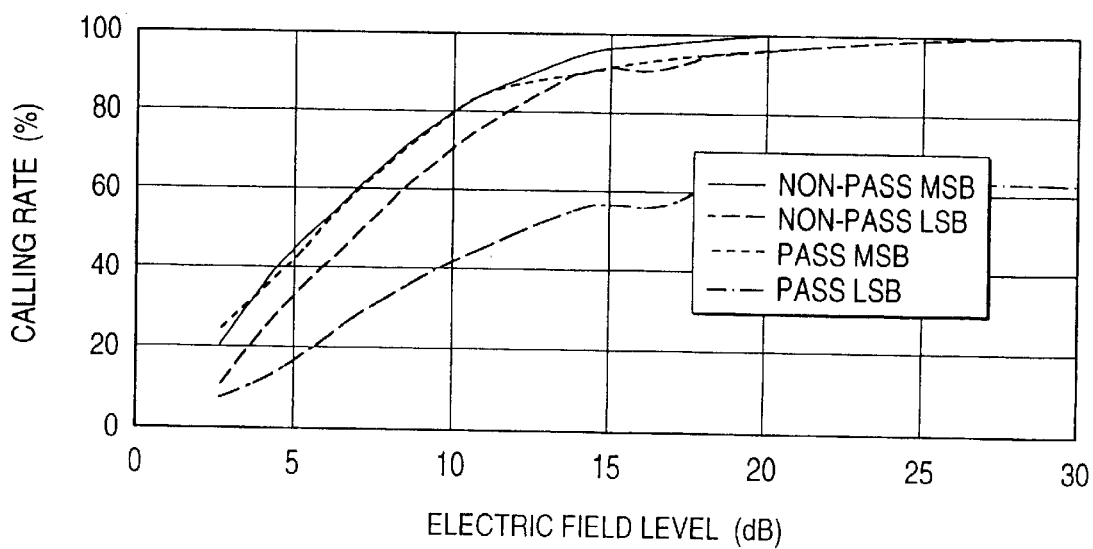
FIG. 7 is a graphic representation for representing an MSB calling rate characteristic and an LSM calling rate characteristic in an overlap area of the FLEX pager with respect to electric field strengths when the input signal passes through, or does not pass through the digital filter.
Figure 8:
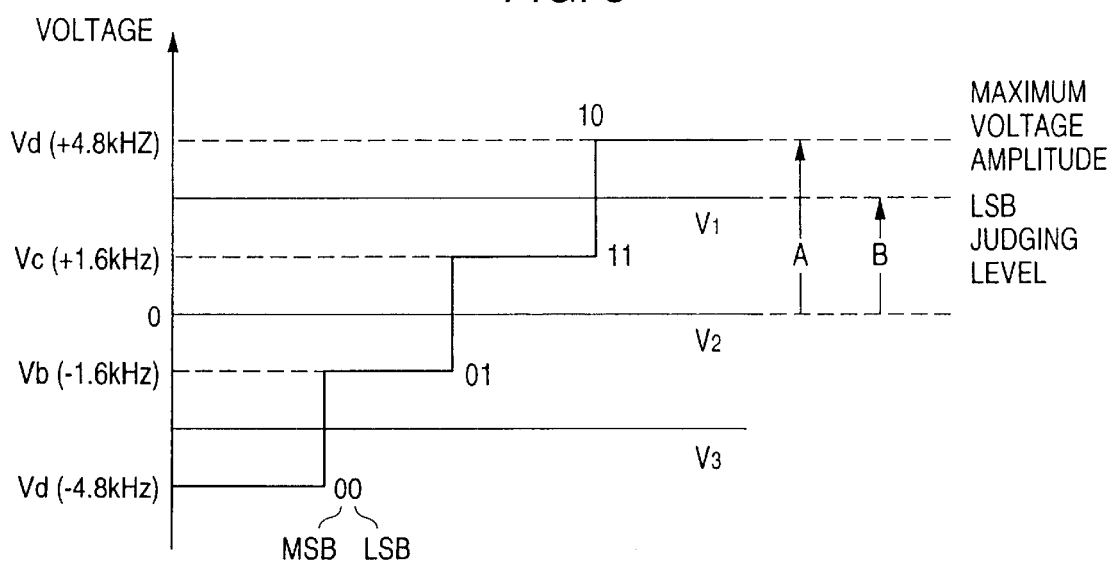
FIG. 8 is an explanatory diagram for explaining a ratio of a voltage amplitude of a detection signal to an LSB judging level.

First, a description will now be made of cutoff frequency control operation of the filter means under control of the digital filter 12. FIG. 7 is a graphic representation indicative of a calling rate characteristic between MSB and LSB in an overlap area of the FLEX pager (namely, overlap characteristic related to filter, control) with respect to an electric field strength when a filter signal passes through the digital filter 12, or does not pass therethrough. FIG. 8 is a diagram for explaining a ratio of a voltage amplitude of a detection signal to an LSB judging level. The graphic representation of FIG. 7 indicates such a case that the frequency offset is 50 Hz, an overlap occurs under condition with delay time of 50 μs, and the ratio of the voltage amplitude of the detection signal to the LSB judging level is 64%. This ratio is indicated by A:B=1:0.64 indicated in FIG. 8, namely A (maximum voltage amplitude of detection signal), and B (LSB judging level). In other words, FIG. 7 shows a change in the characteristics of the calling ratio in the overlap area in such a case that while both the output voltage amplitude of the detector 5 and the reference voltage of the data comparator 7 are fixed, only the cutoff frequencies of the low-pass filter 6, and also the cutoff frequency of the filter means by the digital filter 12 are switched.

Figure 9:
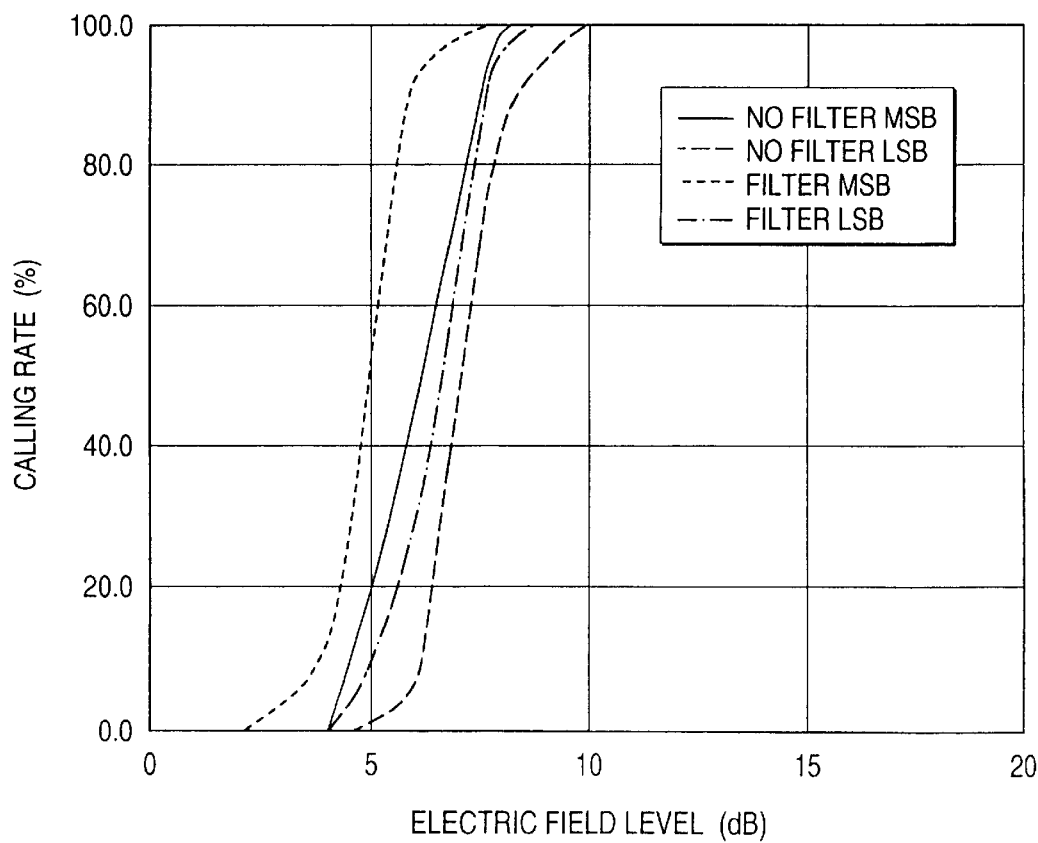
FIG. 9 is a graphic representation for indicating that both an MSB calling rate characteristic and an LSB calling rate characteristic of the FLEX pager in an electric field strength under normal condition where no overlap occurs are indicated, depending upon presence/absence of the digital filter.

Also, FIG. 9 is a graphic representation of calling ratio characteristics between MSB and LSB of the FLEX pager by the electric field strengths under normal condition where no overlap occurs, while the digital filter is employed, or not employed. In FIG. 9, similar to FIG. 7, there is shown such a case that the ratio of the voltage amplitude of the detection signal to the LSB judging level is selected to be 64%. That is to say, FIG. 9 shows a change in the characteristics of the calling ratio in the low electric field in such a case that while both the output voltage amplitude of the detector 5 and the reference voltage of the data comparator 7 are fixed, only the cutoff frequencies of the low-pass filter 6, and also the cutoff frequency of the filter means by the digital filter 12 are switched.

As apparent from the overlap characteristic shown in FIG. 7, the superior calling rates can be achieved in the overlap areas for both LSB and MSB, and thus, the digital signal having small error can be obtained when the input signal does not pass through the digital filter 12. On the other hand, as easily understood from the characteristic of FIG. 9, when the input signal does not pass through the digital filter 12, there is no large difference in the calling rates in the area where the electric field strength is high. However, the calling rates are deteriorated in the area where the electric field strength is low. As apparent from the foregoing descriptions, when the electric field strength is low, the input signal may pass through the digital filter 12 (namely, cutoff frequency is decreased), whereas when the electric field strength is relatively high (namely when electric field strength is higher than, or equal to medium field strength), the input signal does not pass through the digital filter 12 (cutoff frequency is increased). As a consequence, it is possible to set the optimum cutoff frequency in response to the electric field strength, and the bit error rate in the overlap area can be improved. It should also be noted that although not shown in the drawing, since a similar effect can be achieved in the multipath area similar to that of the overlap area, a further explanation thereof is omitted.

It should also be noted that as to the cutoff frequency control of the filter means, a similar effect may be achieved by not only selectively switching the signal penetration/not penetration of the digital filter 12 with employment of the circuit arrangement of FIG. 5, but also changing the frequency of the entered clock signal by employing the circuit arrangement of FIG. 6.

As previously explained, the control circuit 4 precisely detects the electric field strength based upon the electric field strength information PS entered via the electric field strength input unit, and controls the digital filter 12 in accordance with the control condition information PC which is supplied from the CPU 10 and then is entered via the control condition input unit in response to this electric field strength. At this time, while the control condition information PC is stored in the EEPROM 11 and indicates the setting values of the optimum control conditions in correspondence with the high/low electric field strengths, the CPU 10 transfers this control condition information PC to the control circuit 4. For example, the cutoff frequency of the filter means is switched by changing the setting values, depending upon the low electric field strength, and the electric field strength higher than the medium electric field strength. Under any of the electric field strengths, the optimum operation setting operation of the digital filter can be realized.

Figure 10:
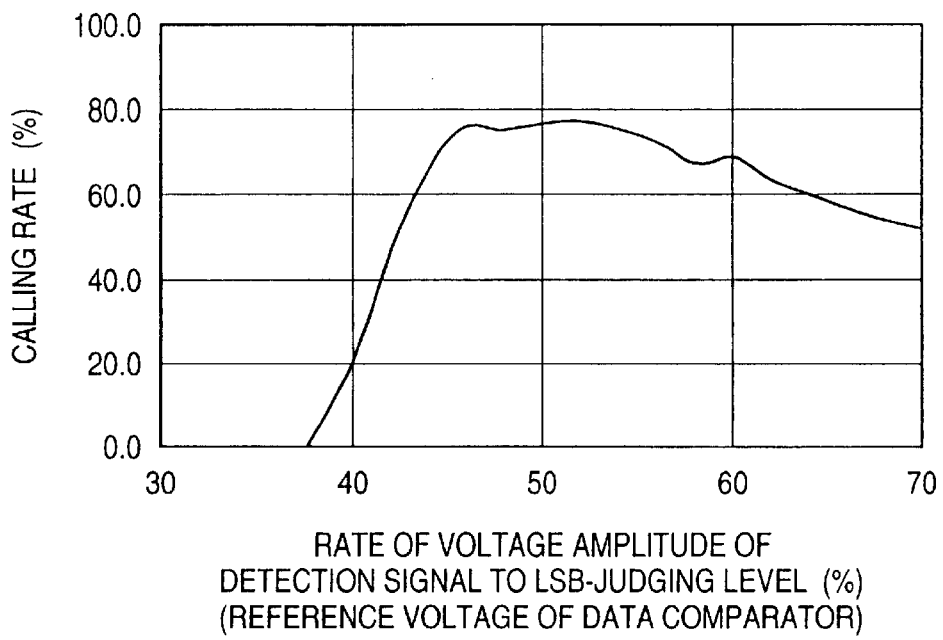
FIG. 10 is a graphic representation for showing an LSB calling rate characteristic in an overlap area of the FLEX pager with respect to a ratio of a voltage amplitude of a detection signal to an LSB judging level.

Next, the control operations for the output voltage amplitude of the detector 5 and the reference voltage of the data comparator 7 will now be described. FIG. 10 is a graphic representation indicative of an LSB calling rate characteristic in an overlap area of an FLEX pager (overlap characteristic related to judging level control) with respect to a ratio of a voltage amplitude of a detection signal to an LSB judging level. The graphic representation of FIG. 10 shows such a case that while the digital filter 12 is set to the pass state under such a condition that the frequency offset is selected to be 50 Hz, and an overlap with delay time of 50 μs occurs, the output voltage amplitude of the detector 5 is fixed. As previously explained with reference to FIG. 7 and FIG. 9, there is a trend that the LSB calling rate is deteriorated in the digitalizing system of the 4-value modulation signal. As a consequence, only the LSB calling rate characteristic is exemplified in this case. Also, since a similar effect of the overlap area may be achieved in the multipath area, a further explanation thereof is omitted.

In other words, FIG. 10 represents a change in the calling rate characteristics in the overlap area of a medium electric field in such a case that while the pass state of the digital filter 12 and the output voltage amplitude of the detector 5 are fixed, the ratio of the voltage amplitude of the detection signal to the LSB judging level is varied by changing the reference voltage of the data comparator 7. In this case, the medium electric field implies such an electric field strength of which the calling rates shown in FIG. 7 and FIG. 9 are substantially saturated.

In the area where the electric field strength is relatively high, even when the reference voltage of the data comparator 7 is changed, there is no large difference in the calling rates. As represented in FIG. 10, in the overlap area of the medium, since the calling rate is changed by varying the reference voltage of the data comparator 7, it can be seen that the calling rates can be kept better by setting the ratio of the voltage amplitude of the detection signal to the LSB judging level to a proper value (for instance 44 to 64%, preferably 47 to 55%). It should also be noted that in the electric field strength higher than the medium electric field, the calling rate may be further increased by increasing the voltage amplitude of the detection signal. As a consequence, if the reference voltages of the data comparator 7 are set in such a way that the calling rates can be optimized every electric field strength based upon the experimentally-acquired results, then the bit error rate in the overlap area can be improved.

Figure 11:
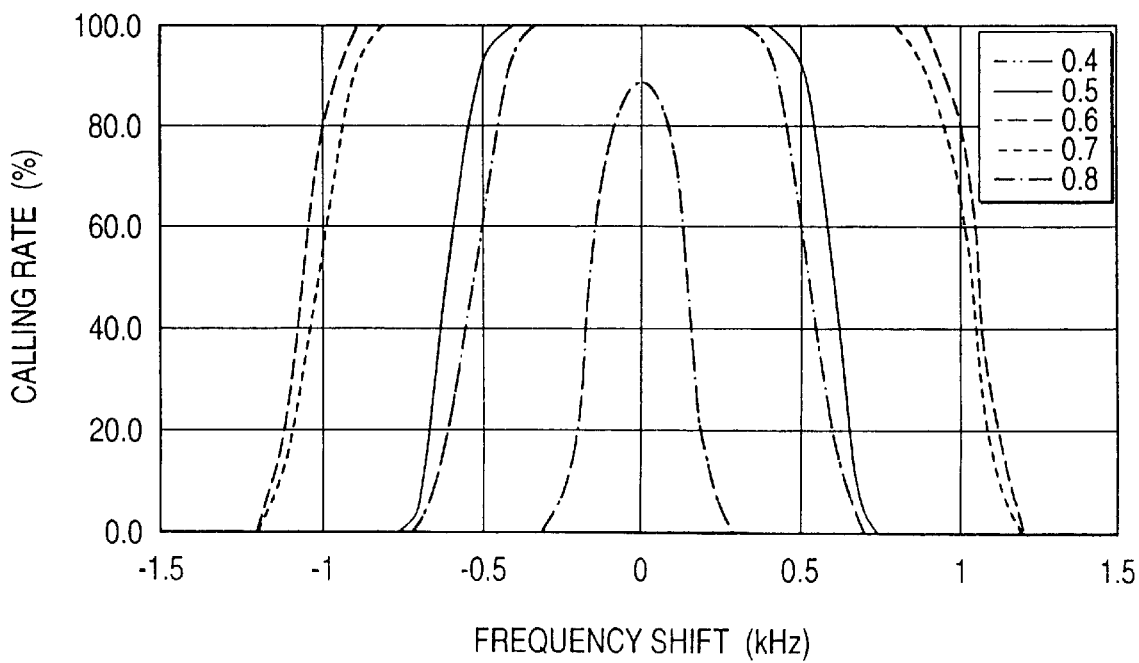
FIG. 11 is a graphic representation for showing an LSB band characteristic in a medium electric field of an FLEX pager with respect to a ratio of a voltage amplitude of a detection signal to an LSB judging level.

FIG. 11 is a graphic representation indicative of an LSB band characteristic in a medium electric field of an FLEX pager corresponding to a ratio of a voltage amplitude of a detection signal to an LSB judging level. The graphic representation of FIG. 11 shows such a case that while the digital filter 12 is set to the pass state, and the output voltage amplitude of the detector 5 is fixed. In this case, only the LSB band characteristic is exemplified. In other words, FIG. 11 represents a change in the band characteristics (bandwidth characteristic of calling rate) in a medium electric field in such a case that while the pass state of the digital filter 12 and the output voltage amplitude of the detector 5 are fixed, the ratio of the voltage amplitude of the detection signal to the LSB judging level is varied by changing the reference voltage of the data comparator 7.

As shown in FIG. 11, in the medium electric field, when the ratio of the output voltage amplitude of the detection signal to the LSB judging level is equal to 0.4, the bandwidth of the allowable frequency shift is the narrowest bandwidth, whereas when this ratio is selected to be 0.4, the bandwidth of the allowable frequency shift is the widest bandwidth. In other words, the band characteristic can be kept better condition by setting the ratio of the output voltage amplitude of the detection signal to the LSB judging level to be on the order of 0.6 to 0.7.

The control circuit 4 controls both the detector 5 and the data comparator 7 in accordance with the electric field strength information PS entered via the electric field strength input unit and also the control condition information PC supplied from the CPU 10 and entered via the control condition input unit. At this time, while considering both the overlap characteristic shown in FIG. 10 and the band characteristic shown in FIG. 11, the control condition information PC which may constitute the optimum setting value corresponding to the high/low electric field strengths is determined and then is supplied to the control circuit 4. For instance while the setting value is changed in the low electric field case and in the field electric case higher than, or equal to the medium electric field, the ratio of the voltage amplitude of the detection signal to the LSB judging level may be switched. Otherwise, the control condition information PC may be determined while any one of the overlap characteristic and the band characteristic is selected with a top priority. As a result of such a control operation, the output voltage amplitude of the detector 5 and the reference voltage of the data comparator 7 can be set under optimum values even in any of the electric field strengths.

In the case that the ratio of the voltage amplitude of the detection signal to the LSB judging level is controlled, not only while the output voltage amplitude of the detector 5 is fixed, the reference voltage used in the data comparator 7 is varied in response to the reference voltage, but also, conversely, while the reference voltage of the data comparator 7 is fixed, the output voltage amplitude of the detector 5 is varied. Alternatively, both the output voltage amplitude and the reference voltage may be varied, so that similar effects may be achieved in any cases.

If such a saving means for saving the control condition information PC is employed in the control circuit 4, then the control condition information PC is no longer transferred from the CPU 10. As a result, the control process operation can be carried out in a simple manner, and also a highspeed response can be performed when the electric field strength information PS is entered. Also, since the control circuit 4 is arranged by a hardware circuit such as a logic circuit, a highspeed process operation can be carried out and furthermore, a highspeed response can be achieved in response to a change in the electric field strengths, as compared with the process operations executed by using the software programs. Otherwise, the demodulating circuit may be arranged by that while the electric field strength information PS is entered, the CPU 10 selects/judges the control condition in correspondence with the electric field strength based upon the control condition information PC, and thereafter supplies the selected/judged control condition to the control circuit 4 for control purposes. Alternatively, while a control means may be formed by combining the respective functions of the CPU 10, the EEPROM 11, and the control circuit 4, this integrated control means may be arranged by way of either a hardware processing circuit or a software processing circuit.

Also, when such setting values adapted to use areas are stored into the EEPROM 11 as the control condition information PC, the optimum control condition information PC may be provided in combination with the reception environment. For instance, the setting values may be changed in accordance with the occurrence conditions of the overlaps and the multipaths different from each other in the respective reception areas. Also, in such an area where the occurrence of the overlap cannot be confirmed, the setting values may be determined in such a manner that the band characteristic of the demodulating circuit is realized with a top priority. It should also be noted that the control condition information PC may be switched in response to the transfer speed of the signal.

As previously explained, both the overlap characteristic and the band characteristic in the overlap area and the multipath area existed under the medium electric field and the high electric field are varied, depending upon the output voltage amplitude of the detector 5, the cutoff frequencies of the low-pass filter 6 and the digital filter 12, and the reference voltage used in the data comparator 7. As a consequence, the setting values of these control conditions are determined in order that the demodulating circuit of this embodiment can be operated under optimum operation conditions in response to the electric field strengths. Therefore, the optimum demodulating operations can be realized in the areas having the various electric field strengths.

SECOND EMBODIMENT MODE

Figure 12:
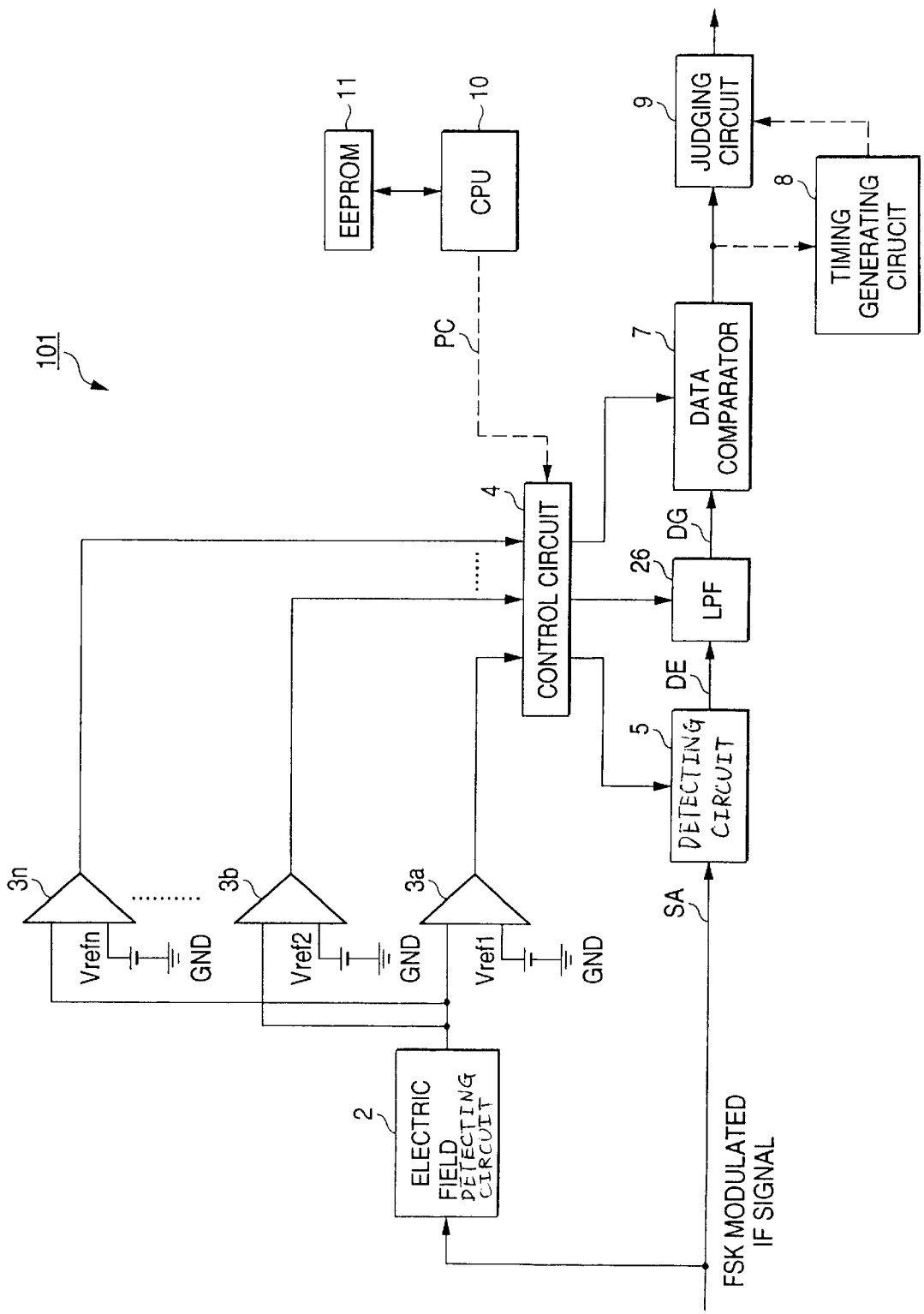
FIG. 12 is a block diagram for representing a demodulating circuit of a wireless receiving apparatus according to a second embodiment mode of the present invention.

FIG. 12 is a block diagram for showing a demodulating circuit of a wireless receiving apparatus, according to a second embodiment mode of the present invention. The demodulating circuit 101 of this second embodiment mode corresponds to a structural example that a post-staged circuit portion of the detector 5 employed in the demodulating circuit 1 of the first embodiment mode is changed. Concretely speaking, while the digital filter 12 is omitted, this demodulating circuit is arranged by that a low-pass filter 26 capable of changing a cutoff frequency is provided instead of the low-pass filter 6, the band pass characteristic of which is fixed. It should be understood that the same reference numerals shown in the first embodiment mode will be employed as those for denoting the same, or similar structural elements in the second embodiment.

In this circuit arrangement, an FSK-modulated IF signal SA is frequency/voltage-converted in the detector 5 to constitute a detection signal DE. Thereafter, a noise component is removed from this detection signal DE by an analog low-pass filter 26. The noise-removed output signal is supplied as a detection signal DG to the digital comparator 7. Then, the detection signal DG is converted into a digital signal by the data comparator 7 in accordance with a reference voltage, and a digital demodulation signal is produced from this digital signal to be outputted in a judging circuit 9. At this time, the control circuit 4 controls the output voltage amplitude of the detector 5, the cutoff frequency of the low-pass filter 26, and the reference voltage of the data comparator 7 based upon both the electric field strength information PS and the control condition information PC.

In the second embodiment mode, the cutoff frequency of the filter means is controlled by varying the cutoff frequency of the low-pass filter 26 in response to an electric field strength. It should also be noted that the control operation by the detector 5 and the data comparator 7 in response to the electric field strength is similar to that of the first embodiment mode. In this case, for example, the band pass characteristic is varied by switching the circuit constants of the low-pass filter 26 by using a switch. As explained in connection with the first embodiment mode, when the digital filter is employed, only such a digital processing operation (e.g., filter is turned ON/OFF and clock frequency is changed) in the digital circuit is carried out in order to control the filter characteristic. As a result, although the circuit design can be easily performed, the complex circuit arrangement is required. On the other hand, in the case that only the analog low-pass filter is employed to construct the filter circuit capable of controlling the filter characteristic in the second embodiment mode, such a digital filter can be deleted, and the entire circuit arrangement can be made simple. However, since it is not negligible about the fluctuations in the component characteristics in the analog circuit, a careful circuit designing attention should be paid.

Also, even in such an arrangement of the second embodiment mode, similar to the first embodiment mode, it is possible to control the cutoff frequency of the filter means and also to select the ratio of the voltage amplitude of the detection signal to the LSB judging level every electric field strength in order to realize the optimum operation setting conditions in response to the electric field strengths. As a consequence, even when the reception environment is changed, the better calling rate characteristic can be maintained and the error rate of the demodulation signal can be improved.

Figure 13:
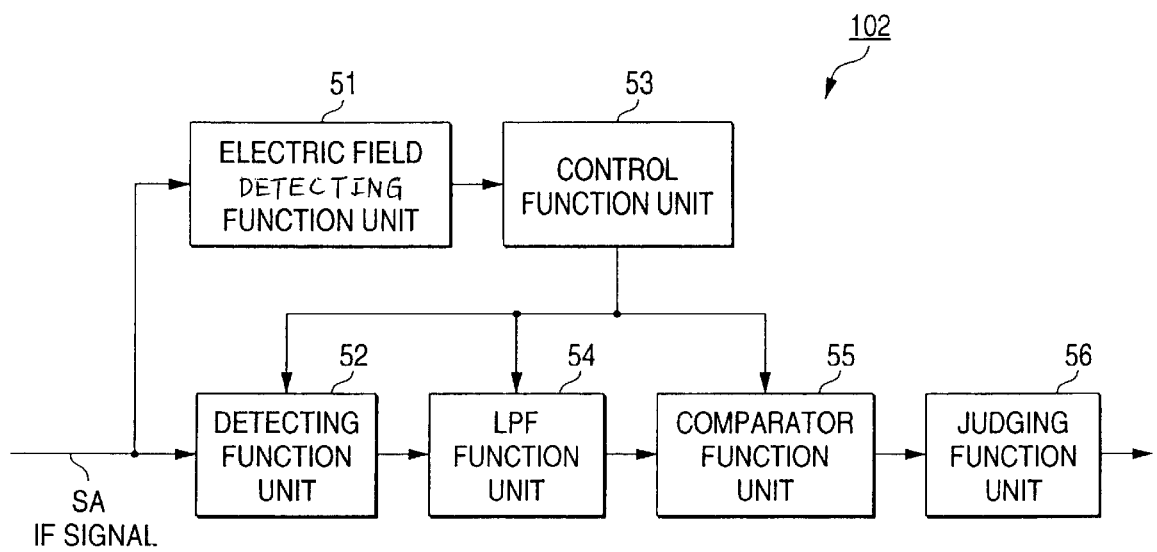
FIG. 13 is a block diagram for showing a modification of a demodulating circuit arranged by a DSP.

FIG. 13 is a block diagram for representing a modification of the demodulating circuit arranged by a DSP (digital signal processor). In the above-explained demodulating circuit according to this second embodiment mode, since the functions of the respective circuit portions may be executed by a software processing operation of such a DSP, the entire demodulating circuit may be arranged by this DSP. As indicated in FIG. 13, the demodulating circuit 102 of this modification is arranged by employing an electric field strength detecting function unit 51, a detection function unit 52, a control function unit 53, an LPF (low-pass filter) function unit 54, a comparator function unit 55, and a judging function unit 56 as the functional blocks corresponding to the functions of the respective circuit portions.

In this circuit arrangement, the control function unit 53 controls the operations of the detection function unit 52, the LPF function unit 54, and also the comparator function unit 55 in response to both the electric field strength information detected by the electric field strength detection function 51, and also preset control condition information. At this time, since setting of the operation parameters is selectively switched in such a manner that the optimum operation condition can be obtained with respect to the electric field strength, the calling rate can be improved in each of the electric field strengths under the low electric field, the medium electric field, and the high electric field. Furthermore, the error rate of the digital demodulation signal outputted from the judging function unit 56 can be reduced.

Figure 14:
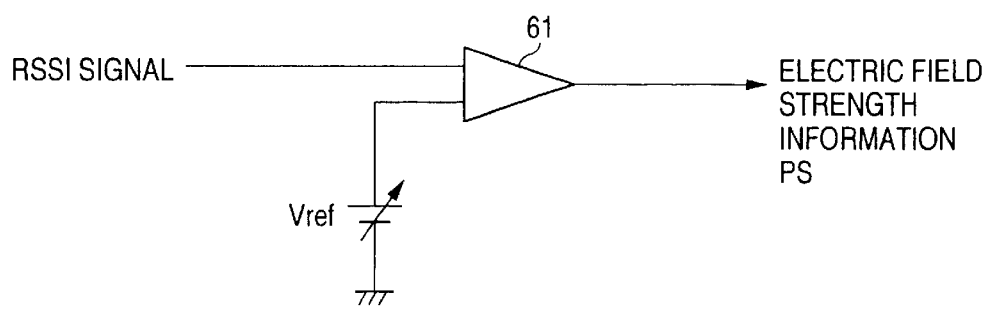
FIG. 14 is a structural diagram for showing a modification of a comparator for outputting electric field strength information.

Also, FIG. 14 is a structural diagram for representing a modification of a comparator capable of outputting electric field strength information. As the electric field strength information outputting comparator, as indicated in the modification of FIG. 14, only a single comparator 61 may be provided instead of a plurality of comparators shown in FIG. 1, and also the reference voltage Vref is variable. In this case, as the electric field strength information PS, two-value information is outputted which defines as to whether or not the voltage value of the RSSI signal outputted from the electric field level detector 2 is higher than the reference voltage Vref. Similar to the control condition information PC, the reference voltage Vref may be set different from each other, depending upon the reception environment of the use areas. Thus, a more precise control for the electric field strengths may be carried out.

It should be also understood that the 4-value FSK modulation signal is employed in the demodulating circuit of the above-explained second embodiment. The present invention is not limited only to this modulation system, but may be applied to other FSK modulation system, or any other modulation systems than this FSK modulation system used in the wireless receiving apparatus. That is, when an analog detection signal is converted into a digital signal of NRZ and the like and this digital signal is judged so as to be demodulated, the present invention may be similarly applied to such a system.

As previously described in detail, in accordance with the demodulating circuit and the demodulating system for the wireless receiving apparatus, the detection signal obtained by detecting the received modulation signal is outputted, the noise component is removed from the detection signal, and then this detection signal is compared with a predetermined reference voltage. As a result, the digital signal corresponding to the modulation signal is outputted, and then the demodulation signal is acquired from this digital signal. At this time, the electric field strength of the reception signal is detected by the modulation signal, and the demodulating circuit method control at least one of the voltage amplitude of the detection signal, the reference voltage, and the cutoff frequency used in removing of the noise component in response to the electric field strength of the detected reception signal. As a consequence, in the wireless receiving apparatus such as the pager, there is an effect that the optimum demodulating operations by the demodulating circuit/method of the present invention can be carried out in the respective electric field strengths as in the low electric field and the electric field higher than, or equal to the medium electric field strength.

As to the cutoff frequency, when the electric field strength is lower than a preselected electric field strength threshold value, the cutoff frequency is controlled to be decreased, whereas when the electric field is higher than a preselected electric field strength threshold value, the cutoff frequency is increased. More specifically, even in the overlap area and the multipath area which occur under high electric field and medium electric field and the reception performance of which is deteriorated, the demodulating operation can be carried out under optimum condition. Thus, the overlap characteristic can be improved, and the error rate of the demodulation signal can be maintained to the low rate. Therefore, the reception preformation of the wireless receiving apparatus can be improved.

What is claimed is:

1. A demodulating circuit of a wireless receiving apparatus for demodulating a received modulation signal to output a demodulation signal, comprising:

electric field level detecting means for detecting an electric field strength of a reception signal based upon said received modulation signal;

detecting means including a detecting unit for detecting said received modulation signal by frequency/voltage converting said received modulation signal to output a detection signal;

filter means for removing a noise component from said reception signal;

comparing means for comparing said detection signal with a predetermined reference voltage to output a digital signal in correspondence with said received modulation signal; and control means for controlling at least one of an amplitude of the voltage outputted from said detecting means, and a cutoff frequency of said filter means in correspondence with the electric field strength detected by said electric field level detecting means.

2. A demodulating circuit of a wireless receiving apparatus as claimed in claim 1, wherein said detecting means further includes a variable gain amplifier; and said control means controls the amplitude of the output voltage of said detecting means by controlling an amplification factor of said variable gain amplifier.

3. A demodulating circuit of a wireless receiving apparatus as claimed in claim 1, wherein said control means controls the output voltage amplitude of said detecting means in response to said electric field strength, so that a ration ratio of the output voltage amplitude of said detecting means to a reference voltage used in said comparing means is controlled to a predetermined value.

4. A demodulating circuit of a wireless receiving apparatus as claimed in claim 1, wherein said filter means is arranged by comprising a low-pass filter provided at a pre-stage of said comparing means, and a digital filter provided at a post-stage of said comparing means.

5. A demodulating circuit of a wireless receiving apparatus as claimed in claim 4, wherein said control means selectively engages or disengages said digital filter in response to said electric field strength.

6. A demodulating circuit of a wireless receiving apparatus as claimed in claim 4, wherein said control means controls a frequency of a clock signal entered into said digital filter in response to said electric field strength.

7. A demodulating circuit of a wireless receiving apparatus as claimed in claim 1, wherein said filter means is arranged by a low-pass filter provided at a pre-stage of said comparing means; and said control means controls a cutoff frequency of said low-pass filter in response to said electric field strength.

8. A demodulating circuit of a wireless receiving apparatus as claimed in claim 1, wherein said demodulating circuit is further comprised of memory means for storing thereinto control condition information related to a plurality of said amplitude of the voltage outputted from said detecting means, a plurality of said reference voltages, and a plurality of said cutoff frequencies, which are set in correspondence with said electric field strength; and further wherein said control means utilizes both electric field strength information indicative of said electric field strength and said control condition information for controlling said at least one of an amplitude of the voltage outputted from said detecting means, and a cutoff frequency of said filter means.

9. A demodulating method of a wireless receiving apparatus for demodulating a received modulation signal to output a demodulation signal, comprising:

an electric.field level detecting step for detecting an electric field strength of a reception signal based upon said received modulation signal;

a detecting step for detecting said received modulation signal by frequency/voltage converting said received modulation signal to output a detection signal;

a noise removing step for removing a noise component from said reception signal;

a digitalizing step for comparing said detection signal with a predetermined reference voltage to output a digital signal in correspondence with said received modulation signal; and a control step for controlling at least one of an amplitude of the voltage of said detection signal, and a cutoff frequency used in said noise removing step in correspondence with the detected electric field strength.

10. A demodulating method of a wireless receiving apparatus as claimed in claim 9, wherein in said control step, the amplitude of the voltage of said detection signal is controlled in response to said electric field strength, so that a ratio of the amplitude of the voltage of said detection signal to the predetermined reference voltage is controlled to a predetermined value.

11. A demodulating method of a wireless receiving apparatus as claimed in claim 9 wherein:

in said control step, when said electric field strength is smaller than a preselected threshold value, the cutoff frequency used in removing of the noise is controlled to be lower than that when said electric field strength is larger than said threshold value.

12. A demodulating circuit of a wireless receiving apparatus for demodulating a received modulation signal to output a demodulation signal, comprising:

electric field level detecting means for detecting an electric field strength of a reception signal based upon said received modulation signal;

detecting means including a detecting unit for detecting said received modulation signal by frequency/voltage converting said received modulation signal, and a variable gain amplifier for amplifying the converted signal to output a detection signal;

filter means for removing a noise component from said reception signal;

comparing means for comparing said detection signal with a predetermined reference voltage to output a digital signal in correspondence with said received modulation signal; and control means for controlling the reference voltage used in said comparing means in correspondence with the electric field strength detected by said electric field level detecting means.

13. A demodulating circuit of a wireless receiving apparatus for demodulating a received modulation signal to output a demodulation signal, comprising:

electric field level detecting means for detecting an electric field strength of a reception signal based upon said received modulation signal;

detecting means for detecting said received modulation signal to output a detection signal;

filter means for removing a noise component from said reception signal;

comparing means for comparing said detection signal with a predetermined reference voltage to output a digital signal in correspondence with said received modulation signal; and control means for controlling the reference voltage used in said comparing means in correspondence with the electric field strength detected by said electric field level detecting means, wherein said filter means is arranged by comprising a low-pass filter provided at a pre-stage of said comparing means, and a digital filter is provided at a post-stage of said comparing means.

14. A demodulating circuit of a wireless receiving apparatus as claimed in claim 13, wherein said control means selectively engages or disengages said digital filter in response to said electric field strength.

15. A demodulating circuit of a wireless receiving apparatus as claimed in claim 13, wherein said control means controls a frequency of a clock signal entered into said digital filter in response to said electric field strength.

16. A demodulating circuit of a wireless receiving apparatus for demodulating a received modulation signal to output a demodulation signal, comprising:

electric field level detecting means for detecting an electric field strength of a reception signal based upon said received modulation signal;

detecting means for detecting said received modulation signal to output a detection signal;

filter means for removing a noise component from said reception signal;

comparing means for comparing said detection signal with a predetermined reference voltage to output a digital signal in correspondence with said received modulation signal; and control means for controlling the reference voltage used in said comparing means in correspondence with the electric field strength detected by said electric field level detecting means, wherein said filter means is arranged by a low-pass filter provided at a pre-stage of said comparing means; and said control means controls a cutoff frequency of said low-pass filter in response to said electric field strength.

17. A demodulating circuit of a wireless receiving apparatus for demodulating a received modulation signal to output a demodulation signal, comprising:

electric field level detecting means for detecting an electric field strength of a reception signal based upon said received modulation signal;

detecting means for detecting said received modulation signal to output a detection signal;

filter means for removing a noise component from said reception signal;

comparing means for comparing said detection signal with a predetermined reference voltage to output a digital signal in correspondence with said received modulation signal; and control means for controlling the reference voltage used in said comparing means in correspondence with the electric field strength detected by said electric field level detecting means, wherein said demodulating circuit is further comprised of memory means for storing thereinto control condition information related to a plurality of said amplitude of the voltage outputted from said detecting means, a plurality of said reference voltages, and a plurality of said cutoff frequencies, which are set in correspondence with said electric field strength; and further wherein said control means utilizes both electric field strength information indicative of said electric field strength and said control condition information for controlling said reference voltage used in said comparing means.

18. A demodulating method of a wireless receiving apparatus for demodulating a received modulation signal to output a demodulation signal, comprising:

an electric field level detecting step for detecting an electric field strength of a reception signal based upon said received modulation signal;

a detecting step for detecting said received modulation signal to output a detection signal;

a noise removing step for removing a noise component from said reception signal;

a digitalizing step for comparing said detection signal with a predetermined reference voltage to output a digital signal in correspondence with said received modulation signal; and a control step for controlling said predetermined reference voltage in correspondence with said detected electric field strength, wherein in said control step, when said electric field strength is smaller than a preselected threshold value, the cutoff frequency used in removing of the noise is controlled to be lower than that when said electric field strength is larger than said threshold value.

19. A demodulating circuit of a wireless receiving apparatus for demodulating a received modulation signal to output a demodulation signal, comprising:

electric field level detecting means for detecting an electric field strength of a reception signal based upon said received modulation signal;

detecting means including a detecting unit for detecting said received modulation signal by frequency/voltage converting said received modulation signal to output a detection signal;

filter means for removing a noise component from said reception signal;

comparing means for comparing said detection signal with a predetermined reference voltage to output a digital signal in correspondence with said received modulation signal, said comparing means including at least one variable current source; and control means for controlling the reference voltage used in said comparing means in correspondence with the electric field strength detected by said electric field level detecting means.

* * * * *

UNITED STATES PATENT AND TRADEMARK OFFICE
CERTIFICATE OF CORRECTION

PATENT NO.     : 6,597,238 B1
DATED          : July 22, 2003
INVENTOR(S)    : Hidenori Matsumoto et al.

It is certified that error appears in the above-identified patent and that said Letters Patent is hereby corrected as shown below:

Column 6,
Line 40, please delete "high;", and insert therefor -- high --.

Column 7,
Line 13, please delete "signal,DE", and insert therefor -- signal DE --.

Column 8,
Line 52, please delete "filter,", and insert therefor -- filter --.

Column 15,
Line 50, please delete "electric.field", and insert therefor -- electric field --.

Signed and Sealed this

Eighteenth Day of November, 2003

JAMES E. ROGAN
*Director of the United States Patent and Trademark Office*